US012642101B2

(12) United States Patent
Kim et al.

(10) Patent No.: US 12,642,101 B2
(45) Date of Patent: May 26, 2026

(54) SEMICONDUCTOR DEVICE AND METHOD OF FORMING HIGH CRYSTAL QUALITY MAGNETIC LAYER FOR SHIELDING OF LOW FREQUENCY MAGNETIC FIELDS

(71) Applicant: STATS ChipPAC Pte. Ltd., Singapore (SG)

(72) Inventors: ChangOh Kim, Incheon (KR); JinHee Jung, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 559 days.

(21) Appl. No.: 18/193,894

(22) Filed: Mar. 31, 2023

(65) Prior Publication Data

US 2024/0332207 A1 Oct. 3, 2024

(51) Int. Cl.
| | |
|---|---|
| *H10W 42/20* | (2026.01) |
| *H10W 70/05* | (2026.01) |
| *H10W 70/685* | (2026.01) |
| *H10W 74/01* | (2026.01) |
| *H10W 74/10* | (2026.01) |

(52) U.S. Cl.
CPC ........... *H10W 42/20* (2026.01); *H10W 70/05* (2026.01); *H10W 70/093* (2026.01); *H10W 70/685* (2026.01); *H10W 74/016* (2026.01); *H10W 74/117* (2026.01)

(58) Field of Classification Search
None
See application file for complete search history.

(56) References Cited

U.S. PATENT DOCUMENTS

| | | | |
|---|---|---|---|
| 10,388,611 B2 | 8/2019 | Cho et al. | |
| 2017/0256494 A1 | 9/2017 | Briggs et al. | |
| 2020/0243457 A1* | 7/2020 | Kikitsu | H10N 50/80 |
| 2021/0243887 A1* | 8/2021 | Shinkai | H01L 21/56 |

* cited by examiner

*Primary Examiner* — Jay C Chang
(74) *Attorney, Agent, or Firm* — Robert D. Atkins; PATENT LAW GROUP: Atkins and Associates, P.C.

(57) ABSTRACT

A semiconductor device has a substrate and an electrical component disposed over the substrate. An encapsulant is deposited over the electrical component and substrate. A magnetic film material is formed over the encapsulant. The magnetic film material may extend down a side surface of the semiconductor device. The magnetic film material is subject to laser spike annealing in a magnetic field. A shielding layer is formed over the magnetic film material. The laser spike annealing of the magnetic film material in the magnetic field can be done after forming the shielding layer. The shielding layer may extend down a side surface of the semiconductor device. A first magnet is disposed on a first side of the semiconductor device. A second magnet is disposed on a second side of the semiconductor device opposite the first side of the semiconductor device.

14 Claims, 16 Drawing Sheets

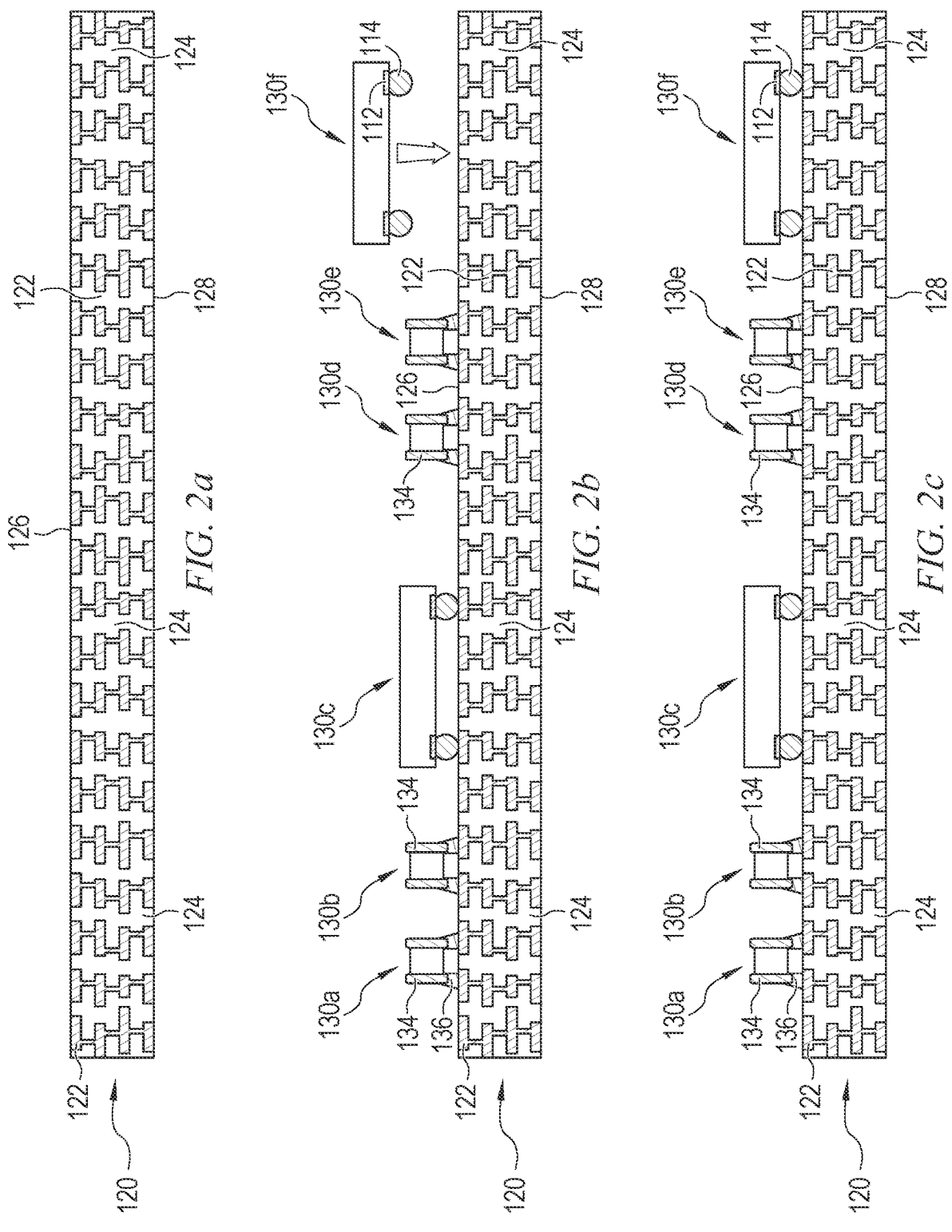

SEMICONDUCTOR DEVICE AND METHOD OF FORMING HIGH CRYSTAL QUALITY MAGNETIC LAYER FOR SHIELDING OF LOW FREQUENCY MAGNETIC FIELDS

FIELD OF THE INVENTION

The present invention relates in general to semiconductor devices and, more particularly, to a semiconductor device and method of forming a high crystal quality magnetic film layer for shielding of low frequency magnetic fields.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices, particularly in high frequency applications, such as radio frequency (RF) wireless communications, often contain one or more integrated passive devices (IPDs) to perform necessary electrical functions. Multiple semiconductor die and IPDs can be integrated into a system-in-package (SiP) module for higher density in a small space and extended electrical functionality. Within the SiP module, semiconductor die and IPDs are disposed on a substrate for structural support and electrical interconnect. An encapsulant is deposited over the semiconductor die, IPDs, and substrate.

The SiP module includes high speed digital and RF electrical components, highly integrated for small size and low height, and operating at high clock frequencies and high power rating. An electromagnetic shielding material is commonly conformally applied over the encapsulant. The electromagnetic shielding material reduces or inhibits electromagnetic interference (EMI), radio frequency interference (RFI), and other inter-device interference, for example as radiated by high-speed digital devices, from affecting neighboring devices within or adjacent to SiP module.

Electrical components within the SiP module may also be susceptible to or generate low frequency magnetic fields from sources such as wireless power charging (Qi-WPC), near field communications (NFC), radio frequency identification (RFID), power management adapter (PMA), wireless charging transmitter (WCT), switching power supplies, inductor modules, and magnetic RAM, as well as electromagnetic noise interference radiated by the SiP or circuits with high frequencies and densities. The high frequency shielding is often ineffective against low frequency magnetic fields. A magnetic film can reduce the effects of the low frequency magnetic fields. However, magnetic film produced by PVD typically exhibits low permeability due to crystalline defects. In addition, applying magnetic film using a lamination process can lead to delamination at the interface magnetic film and EMC or shielding layer.

BRIEF DESCRIPTION OF THE DRAWINGS

FIGS. 2a-2h illustrate a process of forming a high crystal quality magnetic film layer for shielding of low frequency magnetic fields using laser spike annealing in a magnetic field;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The features shown in the figures are not necessarily drawn to scale. Elements having a similar function are assigned the same reference number in the figures. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
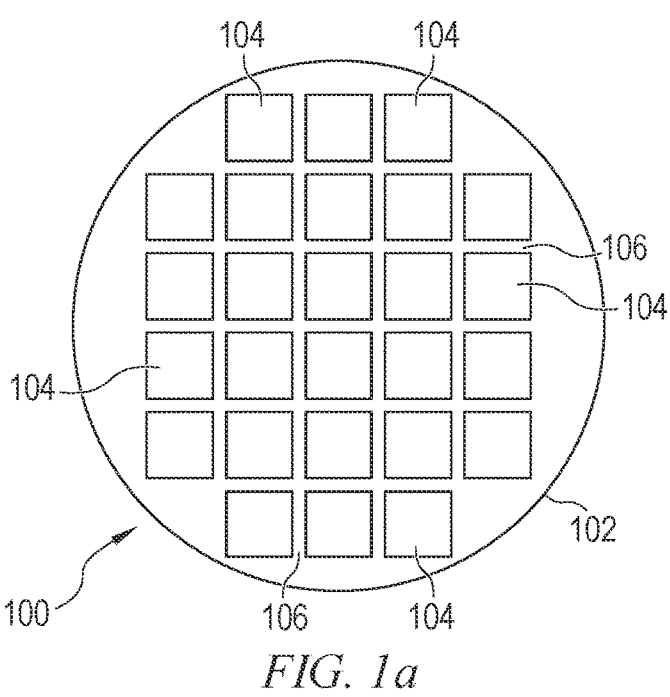
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or electrical components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
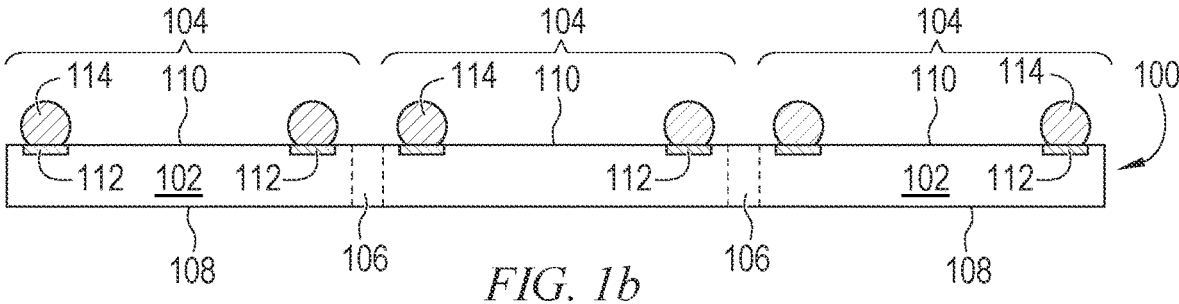

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using physical vapor deposition (PVD), chemical vapor deposition (CVD), electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
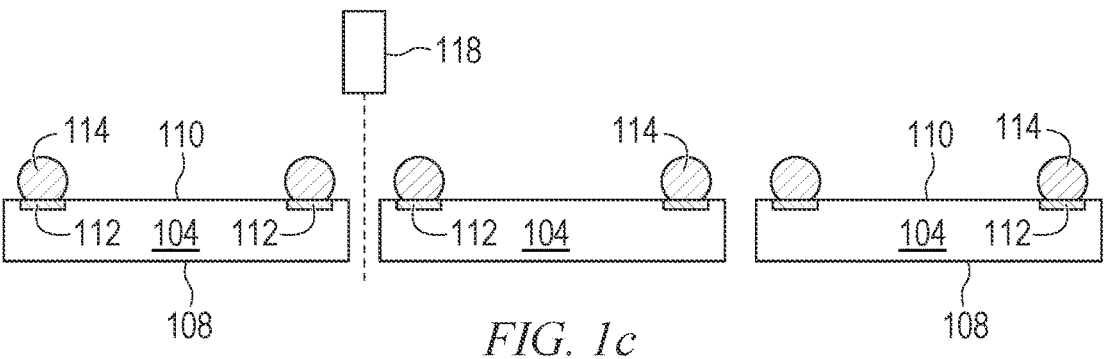

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die or known good unit (KGD/KGU) post singulation.

Figures 2D, 2E:
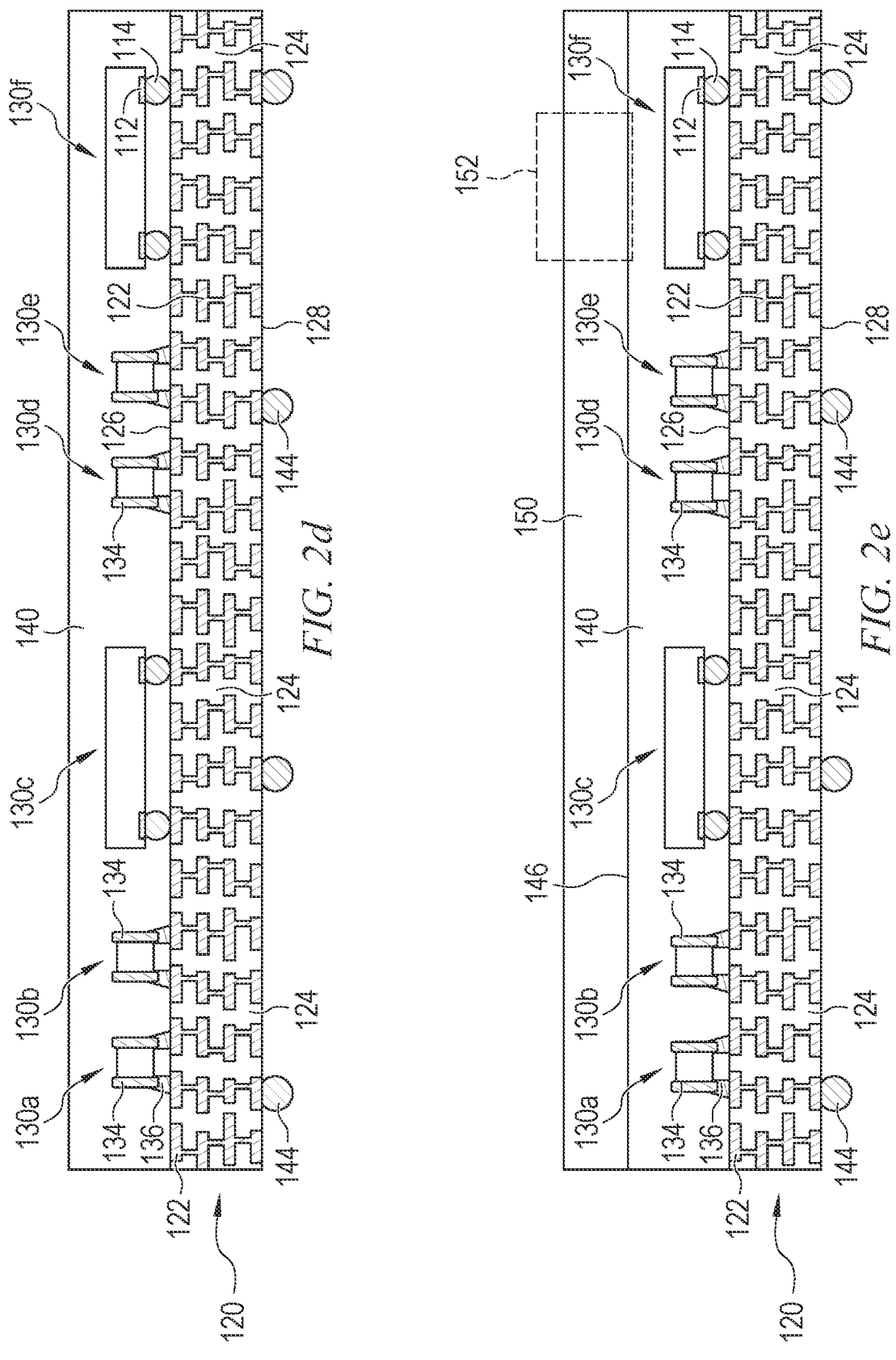

FIGS. 2a-2h illustrate a process of forming a high crystal quality magnetic film layer for shielding of low frequency magnetic fields using laser spike annealing in a magnetic field. FIG. 2a shows a cross-sectional view of multi-layered interconnect substrate 120 including conductive layers 122 and insulating layer 124. Conductive layer 122 can be one or more layers of Al, Cu, Sn, Ni, Au, Ag, or other suitable electrically conductive material. Conductive layers can be formed using PVD, CVD, electrolytic plating, electroless plating process, or other suitable metal deposition process. Conductive layer 122 provides horizontal electrical interconnect across substrate 120 and vertical electrical interconnect between top surface 126 and bottom surface 128 of substrate 120. Portions of conductive layer 122 can be electrically common or electrically isolated depending on the design and function of semiconductor die 104 and other electrical components. Insulating layer 124 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layers can be formed using PVD, CVD, printing, lamination, spin coating, spray coating, sintering or thermal oxidation. Insulating layer 124 provides isolation between conductive layers 122.

In FIG. 2b, electrical components 130a-130f are disposed on surface 126 of interconnect substrate 120 and electrically and mechanically connected to conductive layers 122. For example, electrical components 130a, 130b, 130d, and 130e can be discrete electrical devices, or IPDs, such as a diode, transistor, resistor, capacitor, and inductor. Electrical components 130 and 130f can be, or made similar to, semiconductor die 104 from FIG. 1c with bumps 114 oriented toward surface 126 of substrate 120. Alternatively, electrical components 130a-130f can include other semiconductor die, semiconductor packages, surface mount devices, RF components, discrete electrical devices, or integrated passive devices (IPD).

Electrical components 130a-130f are positioned over substrate 120 using a pick and place operation. Electrical components 130a-130f are brought into contact with conductive layer 122 on surface 126 of substrate 120. Terminals 134 of electrical components 130a, 130b, 130d, and 130e are electrically and mechanically connected to conductive layer 122 using solder or conductive paste 136. Electrical components 130a and 130f are electrically and mechanically connected to conductive layer 122 by reflowing bumps 114. FIG. 2c illustrates electrical components 130a-130f electrically and mechanically connected to conductive layers 122 of substrate 120.

In FIG. 2d, encapsulant or molding compound 140 is deposited over and around electrical components 130a-130f and substrate 120 using a paste printing, compressive molding, transfer molding, liquid encapsulant molding, vacuum lamination, spin coating, or other suitable applicator. Encapsulant 140 can be liquid or granular polymer composite material, such as epoxy resin with filler, epoxy acrylate with filler, or polymer with proper filler. Encapsulant 140 is non-conductive, provides structural support, and environmentally protects the semiconductor device from external elements and contaminants.

An electrically conductive bump material is deposited over conductive layer 122 on surface 128 of substrate 120 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 122 using a suitable attachment or bonding process. In one embodiment, the bump material is reflowed by heating the material above its melting point to form balls or bumps 144. In one embodiment, bump 144 is formed over a UBM having a wetting layer, barrier layer, and adhesive layer. Bump 144 can also be compression bonded or thermocompression bonded to conductive layer 122. In one embodiment, bump 144 is a copper core bump for durability and maintaining its height. Bump 144 represents one type of interconnect structure that can be formed over conductive layer 122. The interconnect structure can also use bond wires, conductive paste, stud bump, micro bump, or other electrical interconnect.

Electrical components 130a-130f may contain IPDs that are susceptible to or generate EMI, RFI, harmonic distortion, and inter-device interference. For example, the IPDs contained within electrical components 130a-130f provide the electrical characteristics needed for high-frequency applications, such as resonators, high-pass filters, low-pass filters, band-pass filters, symmetric Hi-Q resonant transformers, and tuning capacitors. In another embodiment, electrical components 130a-130f contain digital circuits switching at a high frequency, which could interfere with the operation of other IPDs. In the alternative, or in addition, electrical components 130a-130f may be susceptible to or generate low frequency magnetic fields from sources such as Qi-WPC, NFC, RFID, PMA, WCT, switching power supplies, inductor modules, and magnetic RAM, as well as electromagnetic noise interference radiated by the SiP or circuits with high frequencies and densities.

Figure 3A:
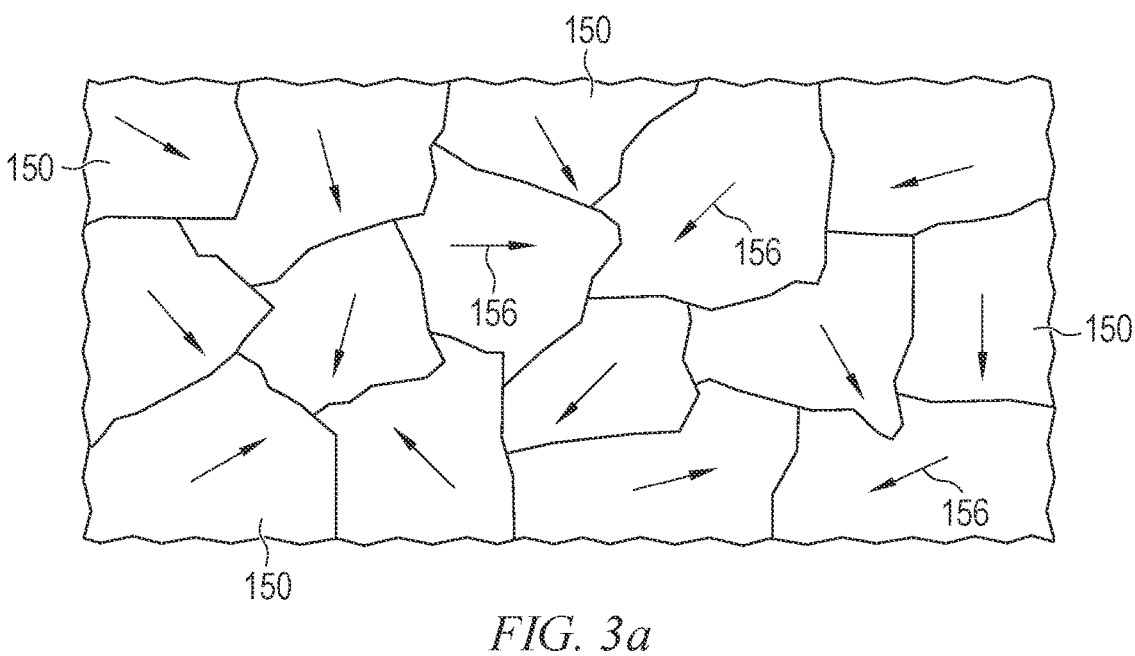
FIGS. 3a-3b illustrate orientation of magnetic spin directions.

To address low frequency magnetic fields, magnetic film material or layer 150 is formed over surface 146 of encapsulant 140, as shown in FIG. 2e. In one embodiment, magnetic film material 150 is an amorphous-like material made with nickel iron (Ni—Fe), Ni—Fe based alloys, ferrites, and other ferromagnetic material and alloys, and deposited by sputtering, PVD, spray, plating, and other suitable deposition processes. Magnetic film material 150 may contain crystalline defects by random orientation of magnetic spin directions. FIG. 3a is an enlargement of box or region 152 from FIG. 2e showing random orientation of magnetic spin directions 156.

Figures 2F, 2G:
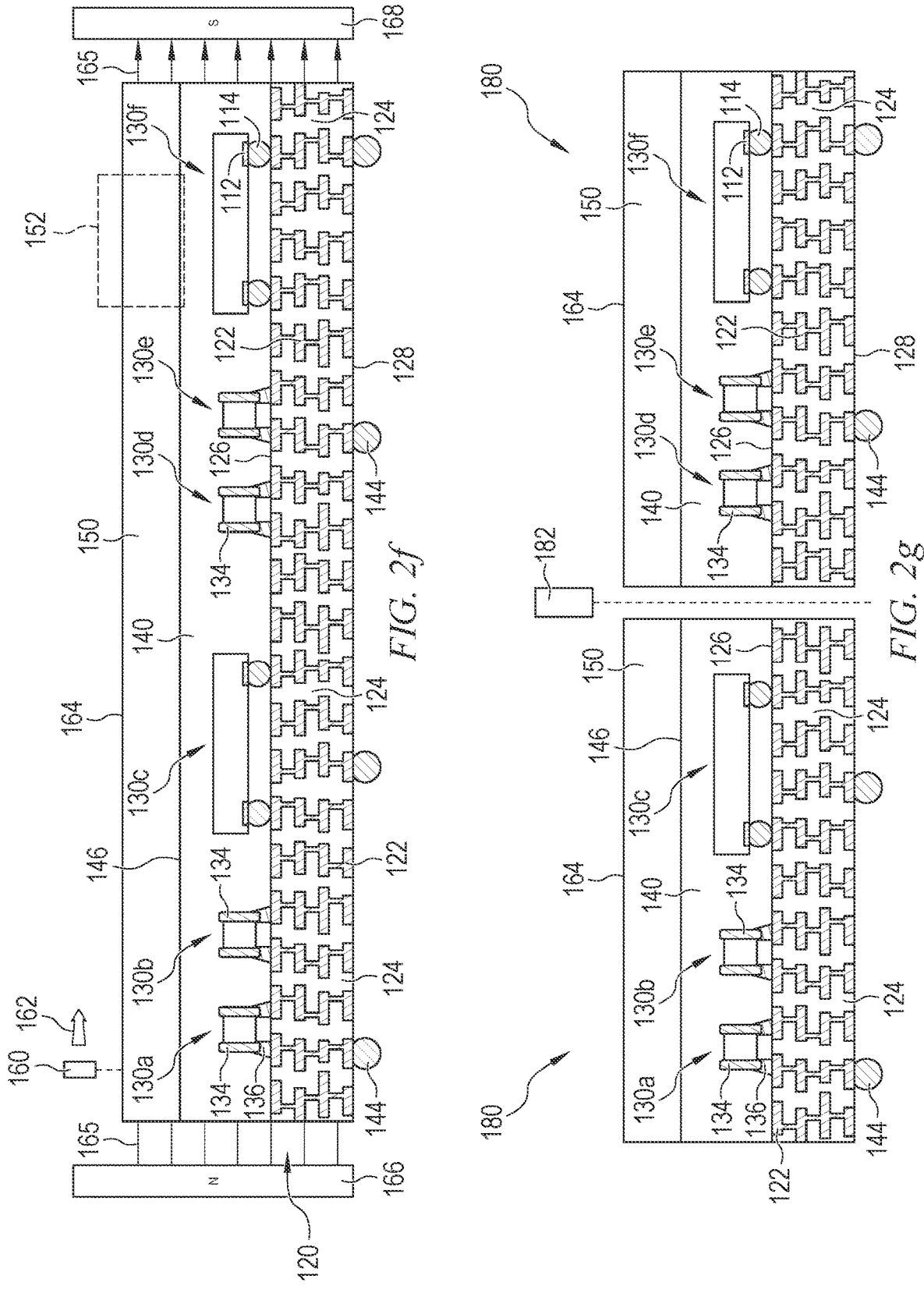
Figure 3B:
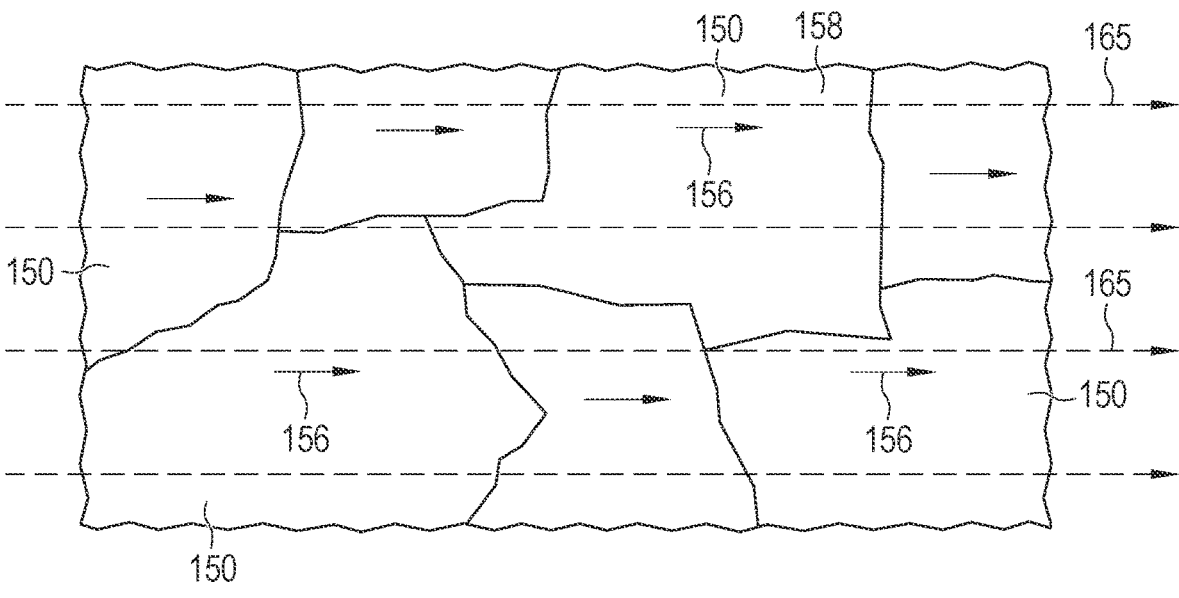

In FIG. 2f, magnetic film material 150 undergoes laser spike annealing by laser 160 scanning or moving in the direction of arrow 162 across the entire surface 164 of the magnetic film material. At the same time, magnetic film material 150 is subject to magnetic field 165 between N-pole magnet 166 and S-pole magnet 168. N-pole magnet 166 is disposed on a first side of substrate 120 and S-pole magnet 168 is disposed on a second side of the substrate opposite the first side of the substrate. The random magnetic spin directions 156 are aligned in one direction in magnetic field 165 to achieve an optimal magnetic property, as shown in FIG. 3b. By laser spike annealing in magnetic field 165, the magnetic film material of FIG. 3a is thereby converted to a high quality magnetic film of FIG. 3b. The alignment of magnetic spin directions 156 increases the magnetic property of magnetic film material 150. The combination of laser spike annealing in magnetic field 165 reduces crystal defects and increases grain size. FIG. 3b shows the size of the magnetic domain 158 as increasing to enhance the crystal quality of magnetic film material 150. Magnetic film material 150 becomes a laser spike annealed magnetic film material.

In FIG. 2g, substrate 120 is singulated using saw blade or laser cutting tool 182 into individual semiconductor packages 180.

Figure 2H:
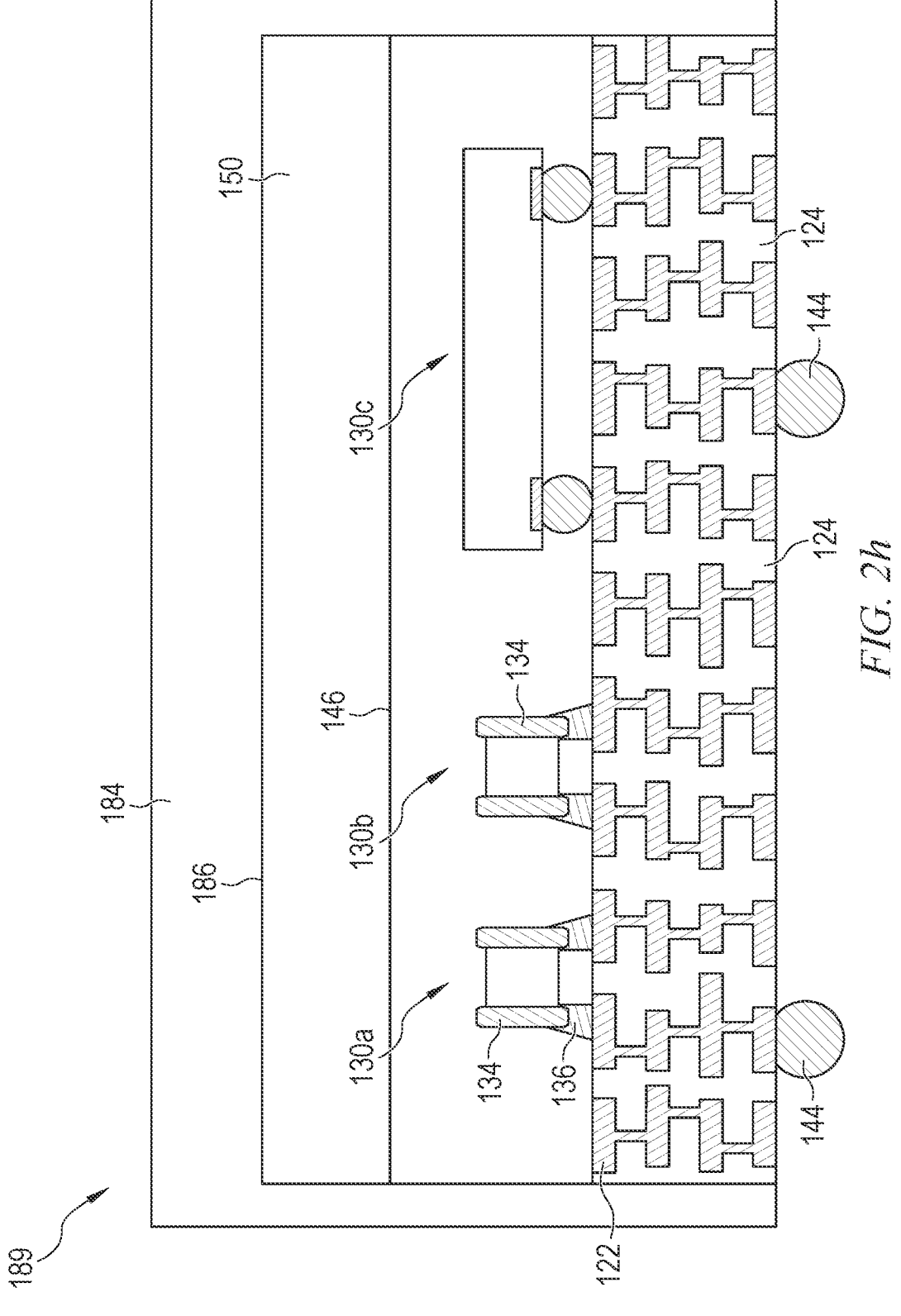

FIG. 2h illustrates semiconductor package 180 post singulation. To address EMI, RFI, harmonic distortion, and inter-device interference, shielding layer 184 is formed over surface 186 of magnetic film material 150 to reduce or inhibit the effects of EMI, RFI, and other inter-device interference. Shielding layer 184 further extends down side surfaces 188 of semiconductor package 180 to electrically connect to conductive layer 122 of substrate 120. Shielding layer 184 can be carbonyl iron, stainless steel, nickel silver, low-carbon steel, silicon-iron steel, foil, conductive resin, carbon-black, aluminum flake, Cu, Sn, Ni, Au, Ag, and other metals, composites, and conductive material capable of dissipating charged particles to ground. Shielding layer 184 can be formed by sputtering. Shielding layer 184 is grounded through interconnect substrate 120. The combination of substrate 120, electrical components 130a-130c, encapsulant 140, magnetic film material 150, and shielding layer 184 constitutes SiP 189.

Figures 4A, 4B:
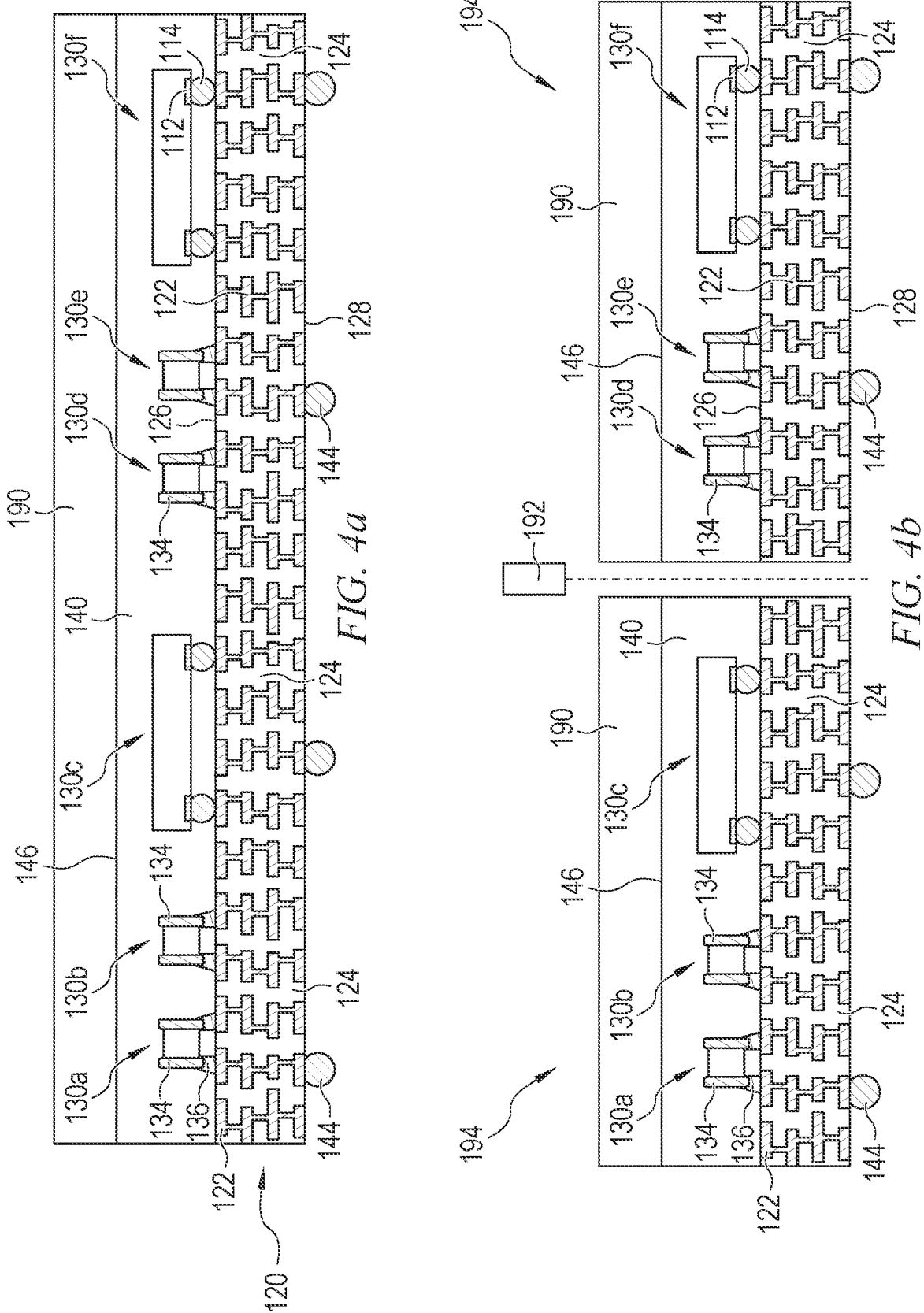
FIGS. 4a-4e illustrate a second embodiment of forming a high crystal quality magnetic film layer for shielding of low frequency magnetic fields using laser spike annealing in a magnetic field.

In another embodiment, continuing from FIG. 2d, shielding layer 190 is formed over surface 146 of encapsulant 140 to reduce or inhibit the effects of EMI, RFI, and other inter-device interference, as shown in FIG. 4a. Shielding layer 190 can be carbonyl iron, stainless steel, nickel silver, low-carbon steel, silicon-iron steel, foil, conductive resin, carbon-black, aluminum flake, Cu, Sn, Ni, Au, Ag, and other metals, composites, and conductive material capable of dissipating charged particles to ground. Shielding layer 190 can be formed by sputtering.

In FIG. 4b, substrate 120 is singulated using saw blade or laser cutting tool 192 into individual semiconductor packages 194.

Figure 4C:
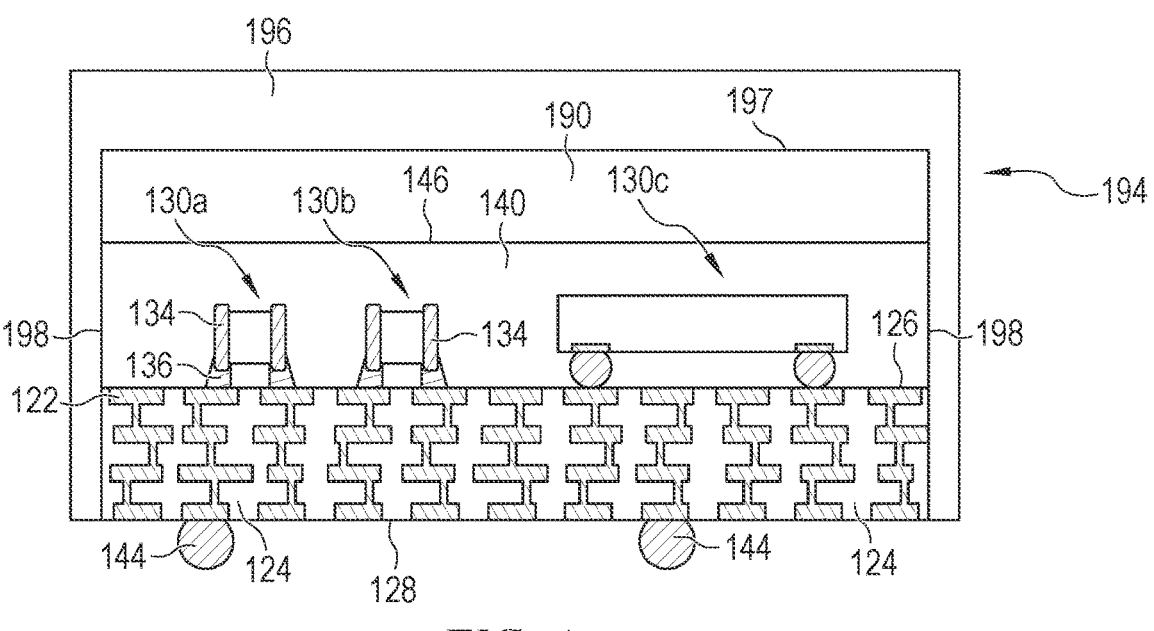

FIG. 4c illustrates semiconductor package 194 post singulation. To address low frequency magnetic fields, magnetic film material or layer 196 is formed over surface 197 of shielding layer 190. Magnetic film material 196 further extends down side surfaces 198 of semiconductor package 194 to electrically connect to conductive layer 122 of substrate 120. In one embodiment, magnetic film material 196 is an amorphous-like material made with Ni—Fe, Ni—Fe based alloys, ferrites, and other ferromagnetic material and alloys, and deposited by sputtering, PVD, spray, plating, and other suitable deposition processes. Magnetic film material 196 may contain crystalline defects by random orientation of magnetic spin directions. Magnetic film material 196 may exhibit random orientation of magnetic spin directions, similar to FIG. 3a.

Figure 4D:
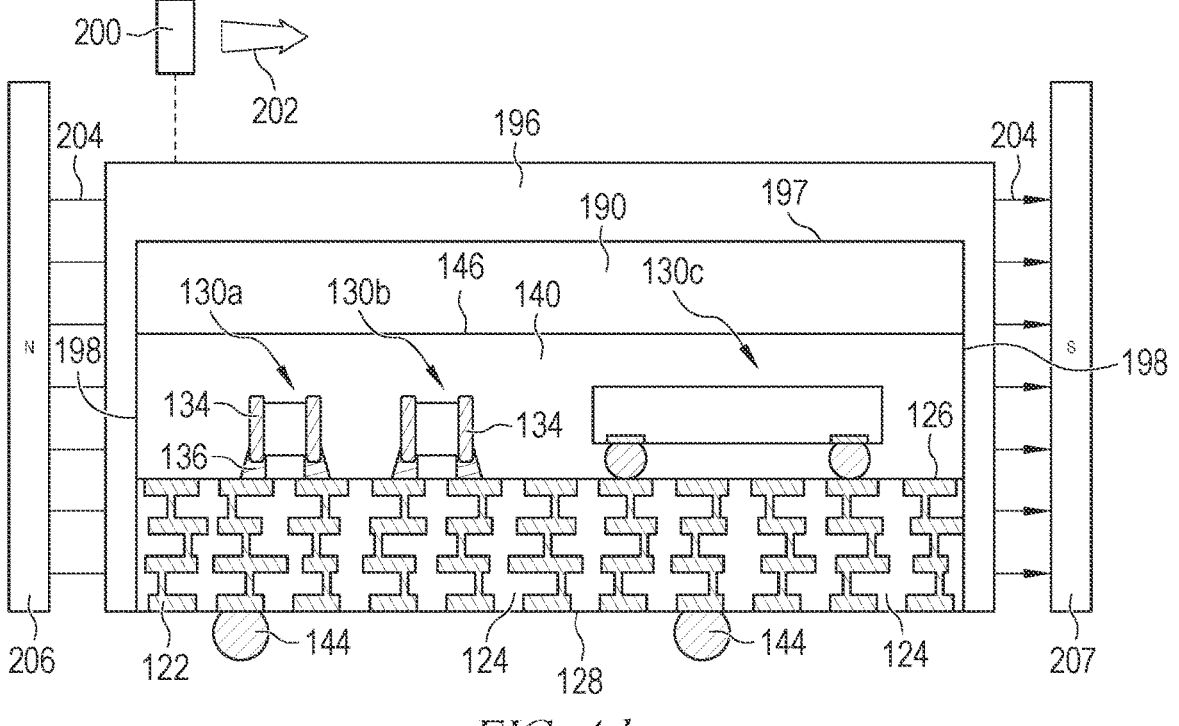
Figure 4E:
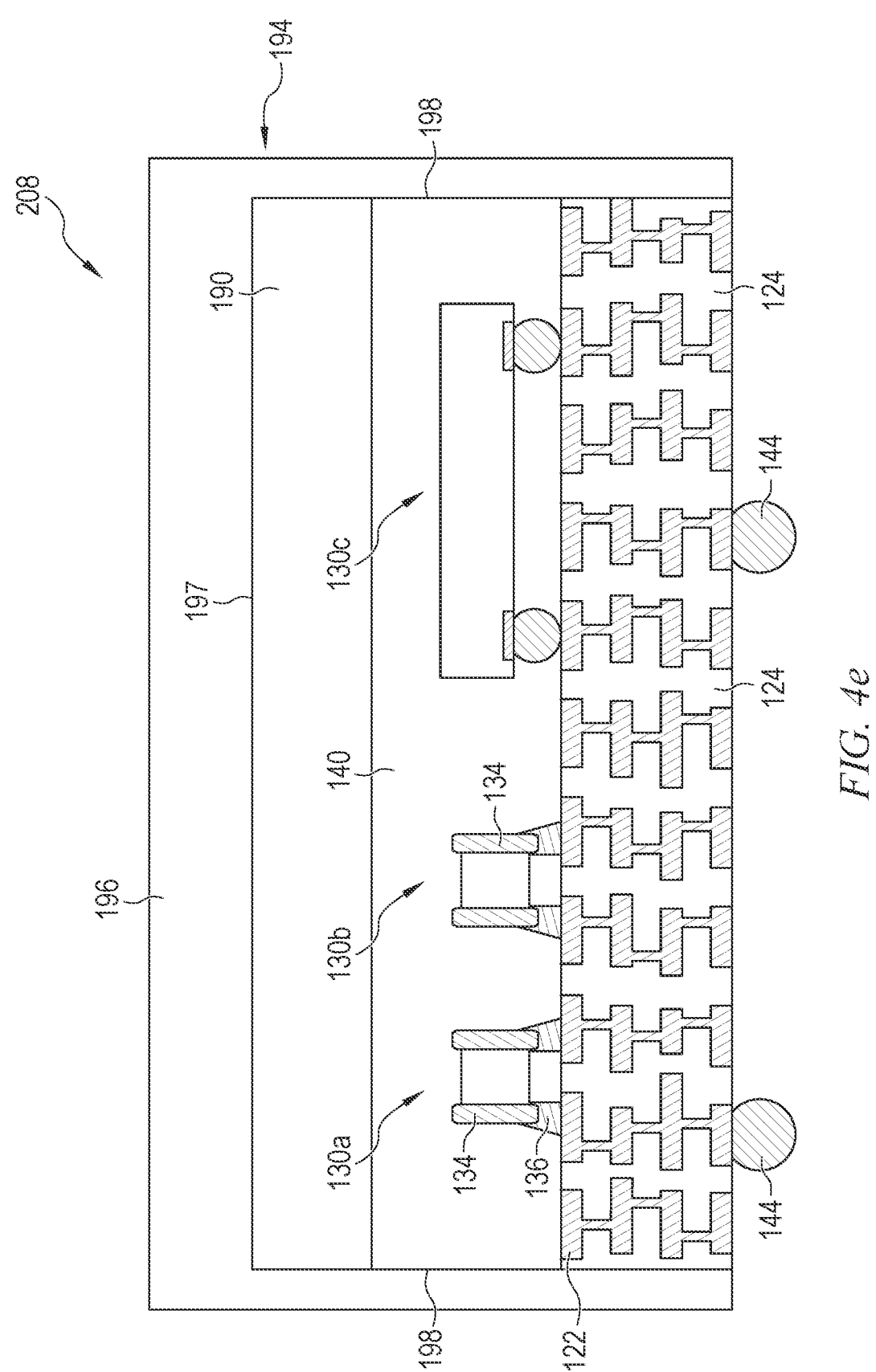

In FIG. 4d, magnetic film material 196 undergoes laser spike annealing by laser 200 scanning or moving in the direction of arrow 202 across the entire surface of the magnetic film material. At the same time, magnetic film material 196 is subject to magnetic field 204 between N-pole magnet 206 and S-pole magnet 207. N-pole magnet 204 is disposed on a first side of semiconductor package 194 and S-pole magnet 206 is disposed on a second side of the semiconductor package opposite the first side of the semiconductor package. The random magnetic spin directions 156 as in FIG. 3a are aligned in one direction in magnetic field 204 to achieve an optimal magnetic property, as shown in FIG. 3b. By laser spike annealing in magnetic field 204, the magnetic film material of FIG. 3a is thereby converted to a high quality magnetic film of FIG. 3b. The alignment of magnetic spin directions 156 increases the magnetic property of magnetic film material 196. The combination of laser spike annealing in magnetic field 204 reduces crystal defects and increases grain size. FIG. 3b shows the size of the magnetic domain 158 as increasing to enhance the crystal quality of magnetic film material 196. Magnetic film material 196 becomes a laser spike annealed magnetic film material. The combination of substrate 120, electrical components 130a-130c, encapsulant 140, shielding layer 190, and magnetic film material 196 constitutes SiP 208, as in FIG. 4e.

Figure 5A:
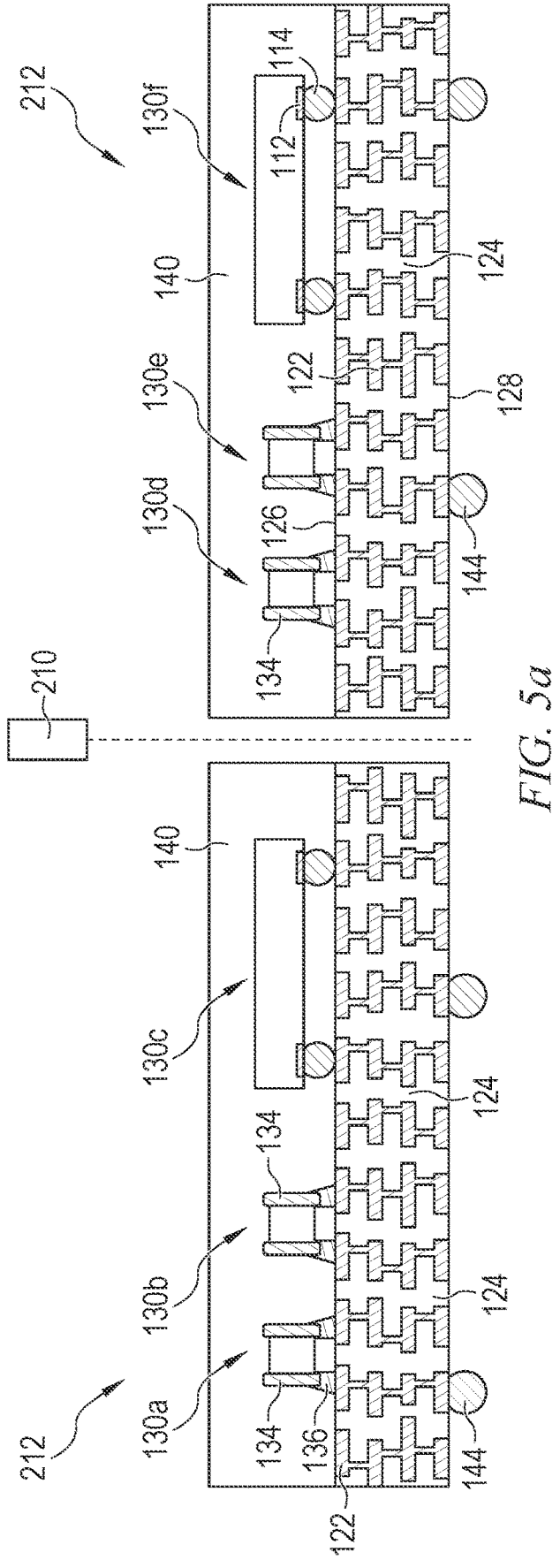
FIGS. 5a-5e illustrate a third embodiment of forming a high crystal quality magnetic film layer for shielding of low frequency magnetic fields using laser spike annealing in a magnetic field.

In another embodiment, continuing from FIG. 2d, substrate 120 is singulated using saw blade or laser cutting tool 210 into individual semiconductor packages 212, as shown in FIG. 5a.

Figure 5B:
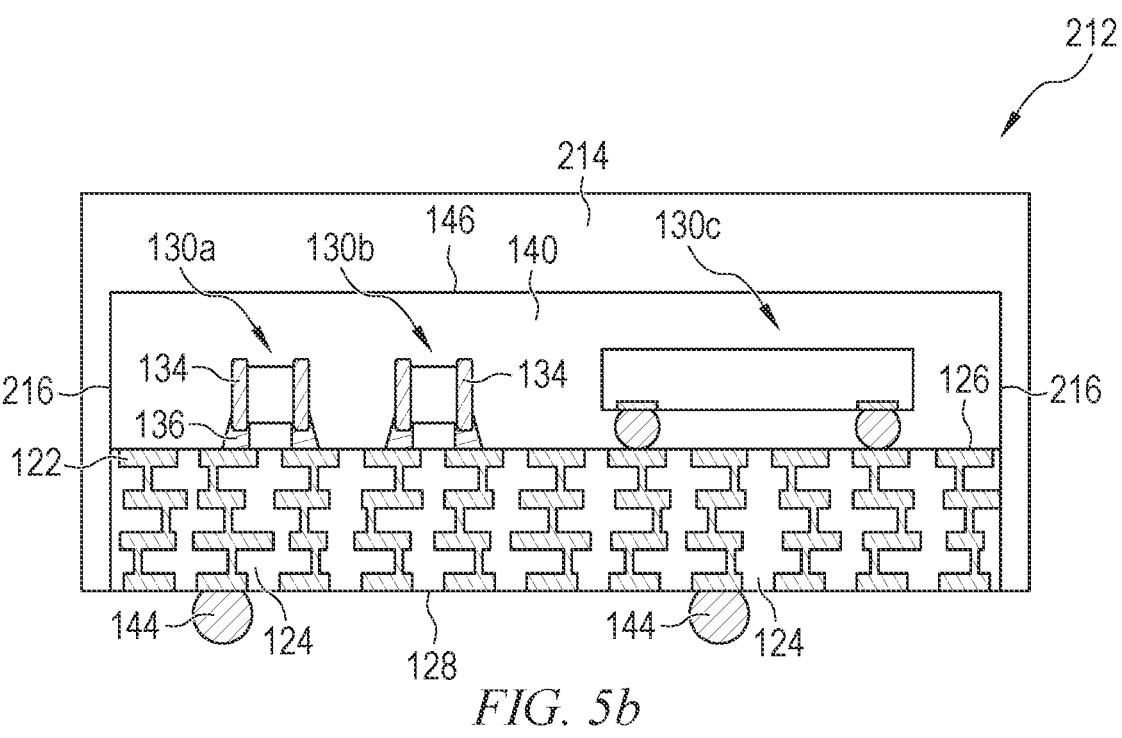

FIG. 5b illustrates semiconductor package 212 post singulation. To address EMI, RFI, harmonic distortion, and inter-device interference, shielding layer 214 is formed over surface 146 of encapsulant 140 to reduce or inhibit the effects of EMI, RFI, and other inter-device interference. Shielding layer 214 further extends down side surfaces 216 of semiconductor package 212 to electrically connect to conductive layer 122 of substrate 120. Shielding layer 214 can be carbonyl iron, stainless steel, nickel silver, low-carbon steel, silicon-iron steel, foil, conductive resin, carbon-black, aluminum flake, Cu, Sn, Ni, Au, Ag, and other metals, composites, and conductive material capable of dissipating charged particles to ground. Shielding layer 214 is grounded through interconnect substrate 120.

Figure 5C:
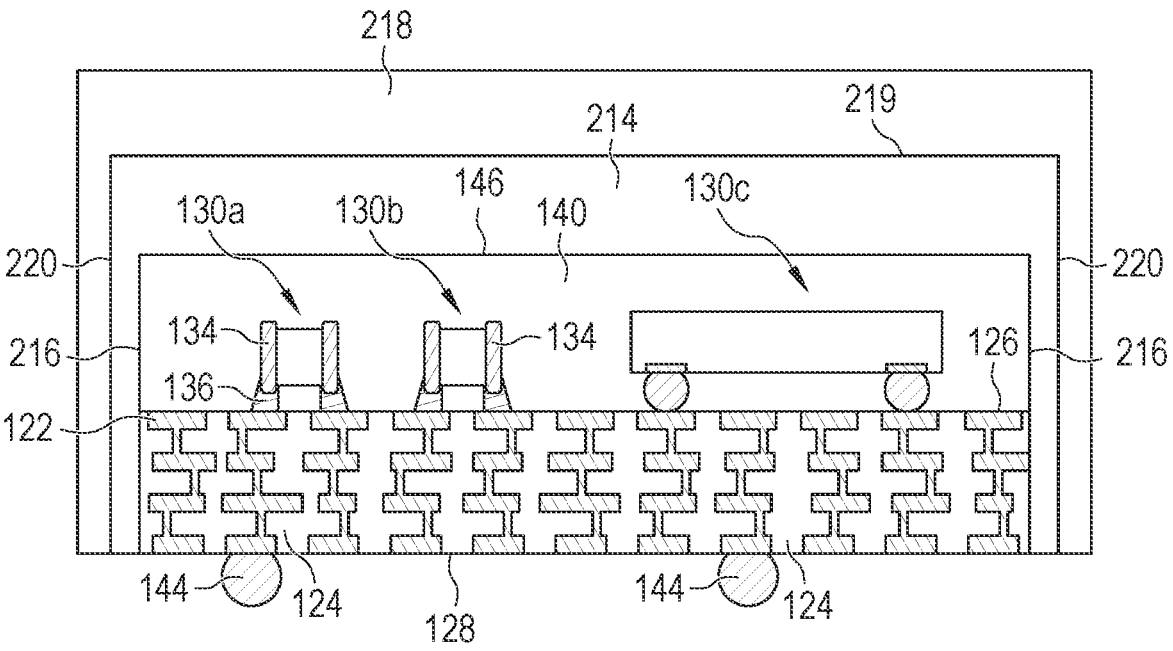

To address low frequency magnetic fields, magnetic film material or layer 218 is formed over surface 219 of shielding layer 214, as shown in FIG. 5c. Magnetic film material 218 further extends down side surfaces 220 of shielding layer 214. In one embodiment, magnetic film material 218 is an amorphous-like material made with Ni—Fe, Ni—Fe based alloys, ferrites, and other ferromagnetic material and alloys, and deposited by sputtering, PVD, spray, plating, and other suitable deposition processes. Magnetic film material 218 may contain crystalline defects by random orientation of magnetic spin directions. Magnetic film material 218 may exhibit random orientation of magnetic spin directions, similar to FIG. 3a.

Figure 5D:
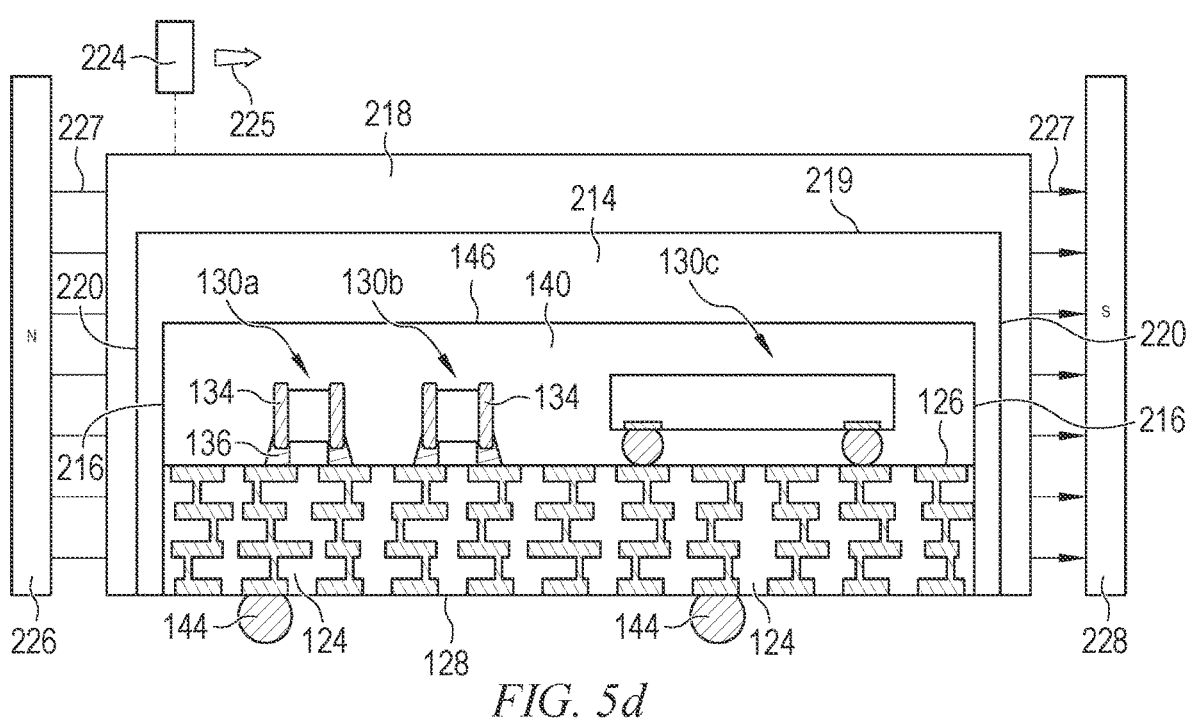
Figure 5E:
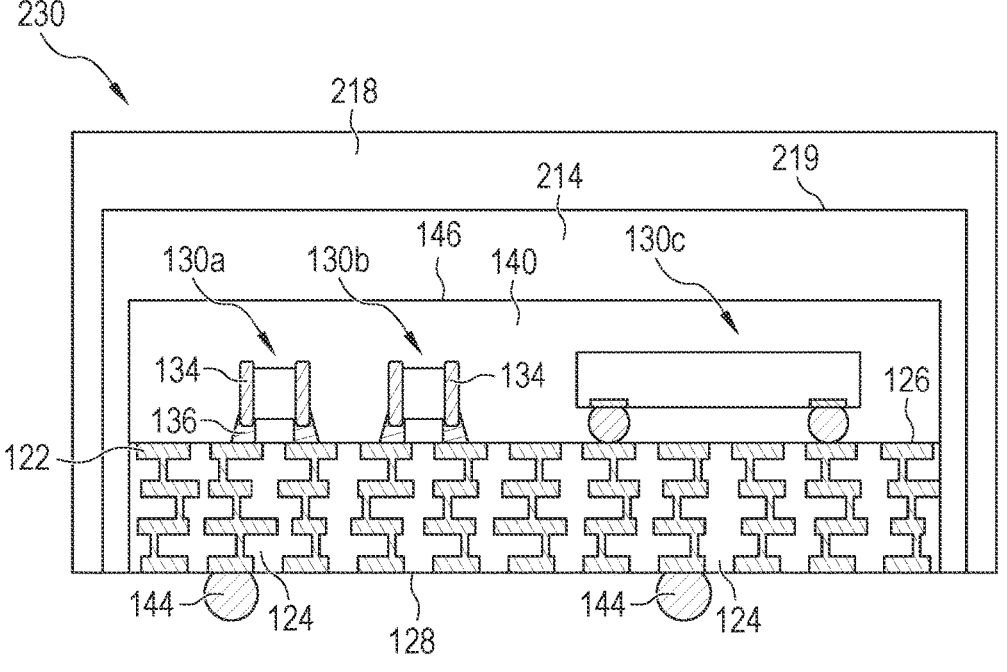

In FIG. 5d, magnetic film material 218 undergoes laser spike annealing by laser 224 scanning or moving in the direction of arrow 225 across the entire surface of the magnetic film material. At the same time, magnetic film material 218 is subject to magnetic field 227 between N-pole magnet 226 and S-pole magnet 228. N-pole magnet 226 is disposed on a first side of semiconductor package 212 and S-pole magnet 228 is disposed on a second side of the semiconductor package opposite the first side of the semiconductor package. The random magnetic spin directions 156 as in FIG. 3a are aligned in one direction in magnetic field 227 to achieve an optimal magnetic property, as shown in FIG. 3b. By laser spike annealing in magnetic field 227, the magnetic film material of FIG. 3a is thereby converted to a high quality magnetic film of FIG. 3b. The alignment of magnetic spin directions 156 increases the magnetic property of magnetic film material 218. The combination of laser spike annealing in magnetic field 227 reduces crystal defects and increases grain size. FIG. 3b shows the size of the magnetic domain 158 as increasing to enhance the crystal quality of magnetic film material 218. Magnetic film material 218 becomes a laser spike annealed magnetic film material. The combination of substrate 120, electrical components 130a-130c, encapsulant 140, shielding layer 214, and magnetic film material 218 constitutes SiP 230, as in FIG. 5e.

Figure 6A:
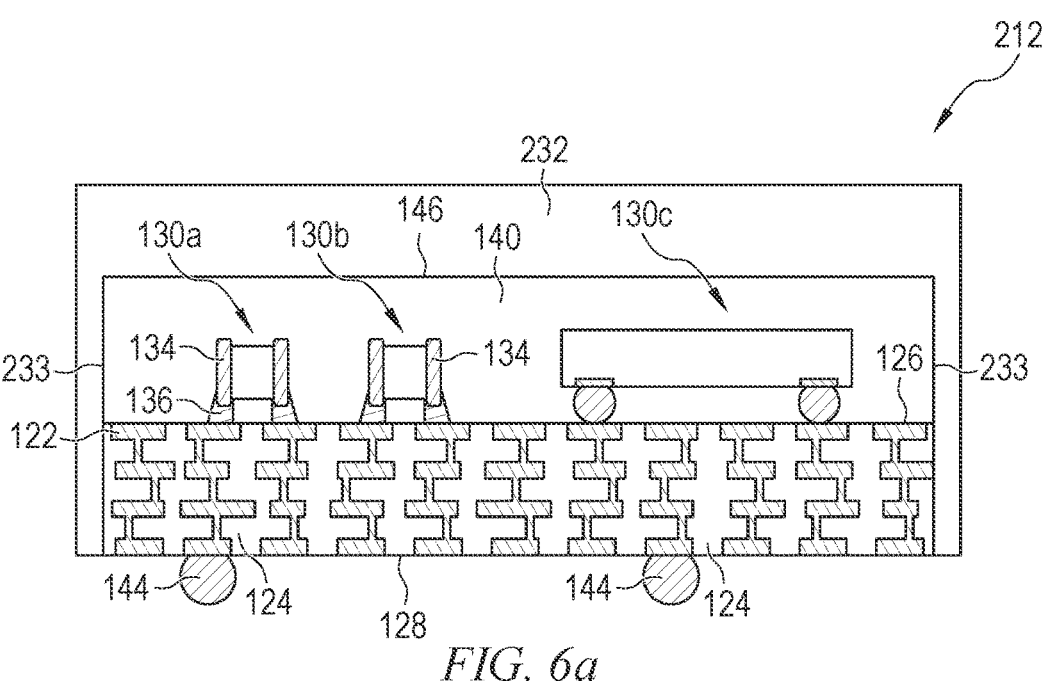
FIGS. 6a-6c illustrate a fourth embodiment of forming a high crystal quality magnetic film layer for shielding of low frequency magnetic fields using laser spike annealing in a magnetic field.

In another embodiment, continuing from FIG. 5a, and to address low frequency magnetic fields, magnetic film material or layer 232 is formed over surface 146 of encapsulant 140, as shown in FIG. 6a. Magnetic film material 232 further extends down side surfaces 233 of semiconductor package 212 to electrically connect to conductive layer 122 of substrate 120. In one embodiment, magnetic film material 232 is an amorphous-like material made with Ni—Fe, Ni—Fe based alloys, ferrites, and other ferromagnetic material and alloys, and deposited by sputtering, PVD, spray, plating, and other suitable deposition processes. Magnetic film material 232 may contain crystalline defects by random orientation of magnetic spin directions. Magnetic film material 232 may exhibit random orientation of magnetic spin directions, similar to FIG. 3a.

Figure 6B:
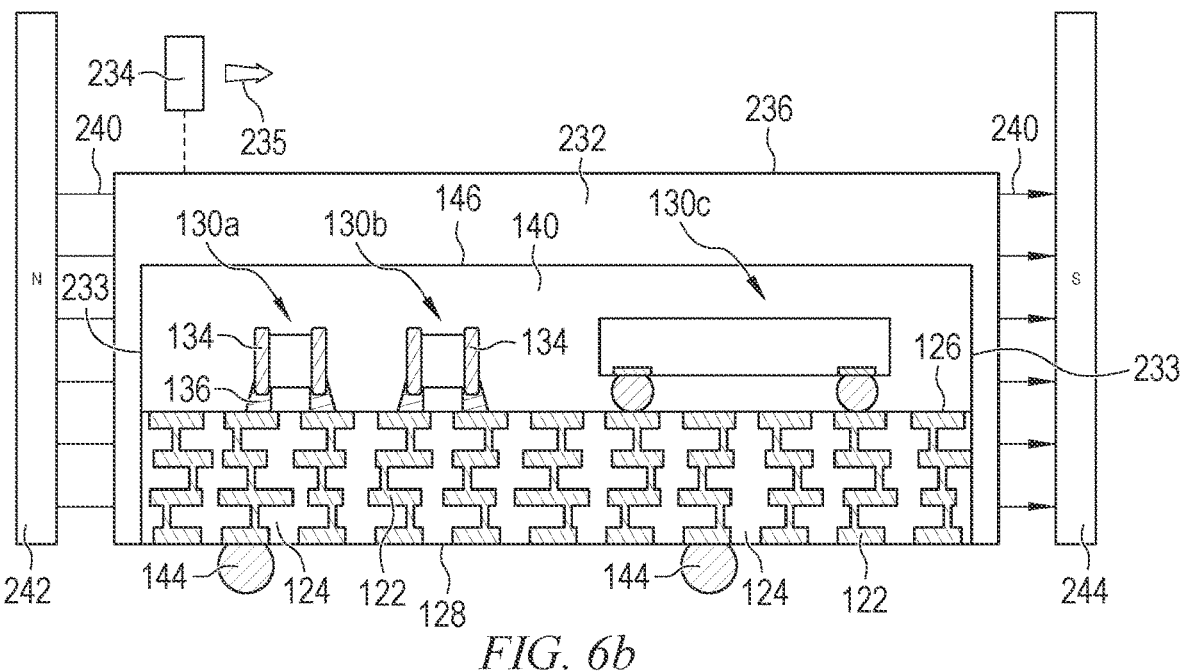
Figure 6C:
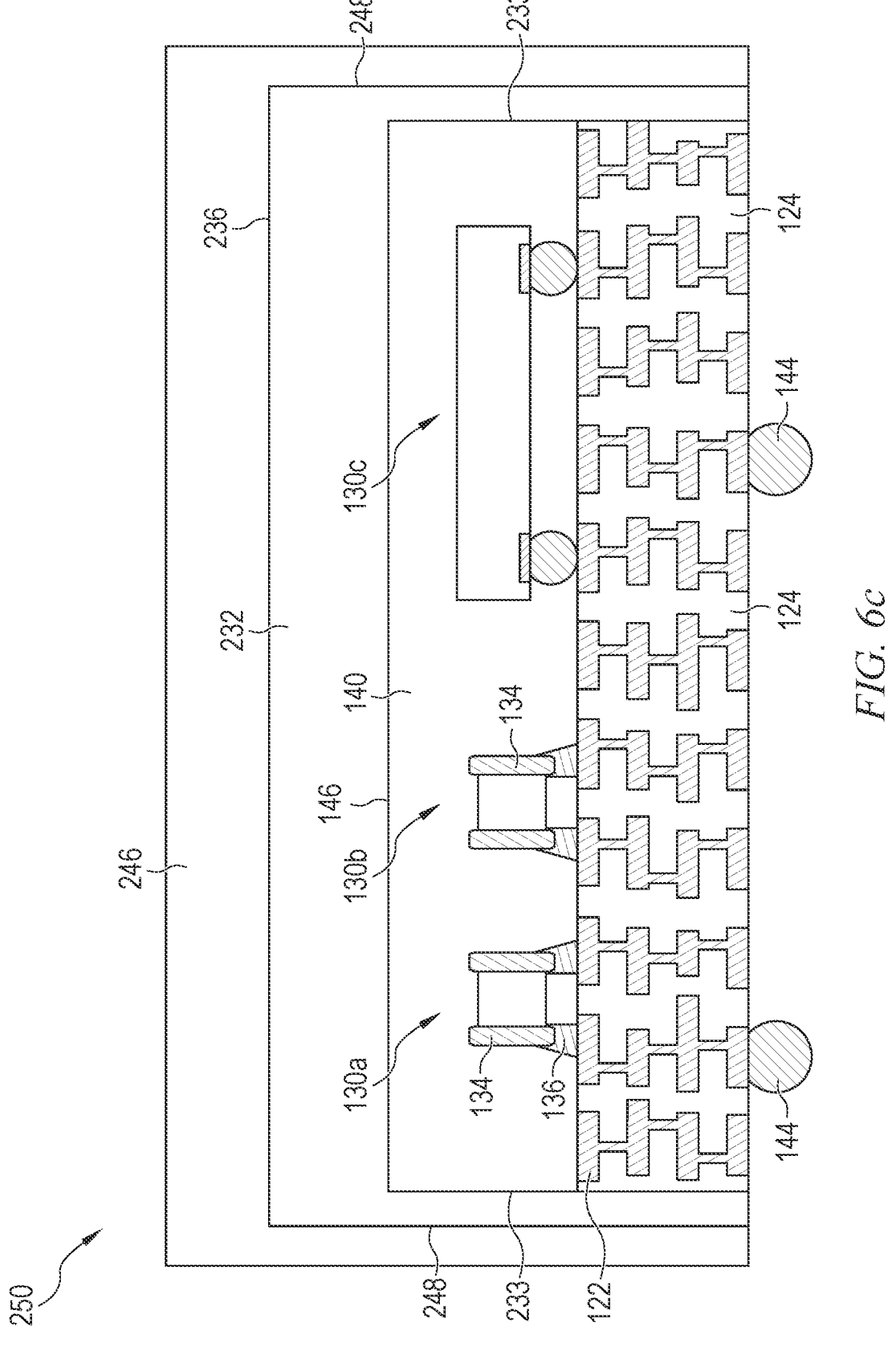

In FIG. 6b, magnetic film material 232 undergoes laser spike annealing by laser 234 scanning or moving in the direction of arrow 235 across the entire surface 236 of the magnetic film material. At the same time, magnetic film material 232 is subject to magnetic field 240 between N-pole magnet 242 and S-pole magnet 244. N-pole magnet 242 is disposed on a first side of semiconductor package 212 and S-pole magnet 244 is disposed on a second side of the semiconductor package opposite the first side of the semiconductor package. The random magnetic spin directions 156 as in FIG. 3a are aligned in one direction in magnetic field 240 to achieve an optimal magnetic property, as shown in FIG. 3b. By laser spike annealing in magnetic field 240, the magnetic film material of FIG. 3a is thereby converted to a high quality magnetic film of FIG. 3b. The alignment of magnetic spin directions 156 increases the magnetic property of magnetic film material 232. The combination of laser spike annealing in magnetic field 240 reduces crystal defects and increases grain size. FIG. 3b shows the size of the magnetic domain 158 as increasing to enhance the crystal quality of magnetic film material 232. Magnetic film material 232 becomes a laser spike annealed magnetic film material.

To address EMI, RFI, harmonic distortion, and inter-device interference, shielding layer 246 is formed over surface 236 of magnetic film material 232 to reduce or inhibit the effects of EMI, RFI, and other inter-device interference. Shielding layer 246 further extends down side surfaces 248 of semiconductor package 212 to electrically connect to conductive layer 122 of substrate 120. Shielding layer 246 can be carbonyl iron, stainless steel, nickel silver, low-carbon steel, silicon-iron steel, foil, conductive resin, carbon-black, aluminum flake, Cu, Sn, Ni, Au, Ag, and other metals, composites, and conductive material capable of dissipating charged particles to ground. Shielding layer 248 is grounded through interconnect substrate 120. The combination of substrate 120, electrical components 130a-130c, encapsulant 140, magnetic film material 232, and shielding layer 248 constitutes SiP 250, as in FIG. 6b.

Figure 7:
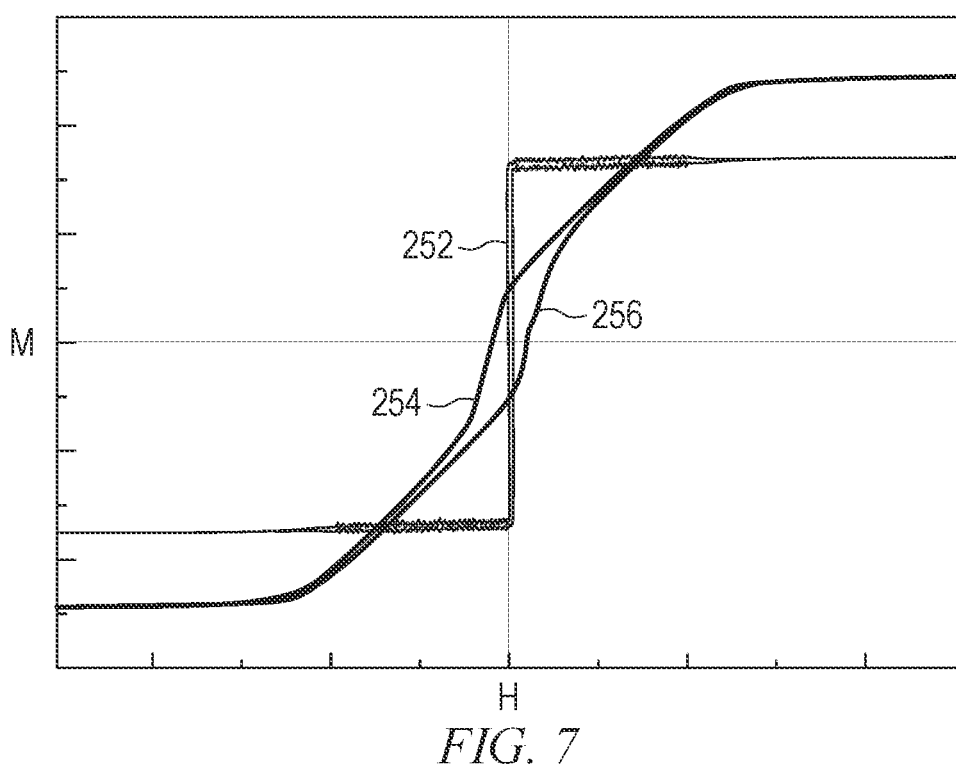
FIG. 7 illustrates M and H magnetic fields for the magnetic film layer prior to laser annealing.
Figure 8:
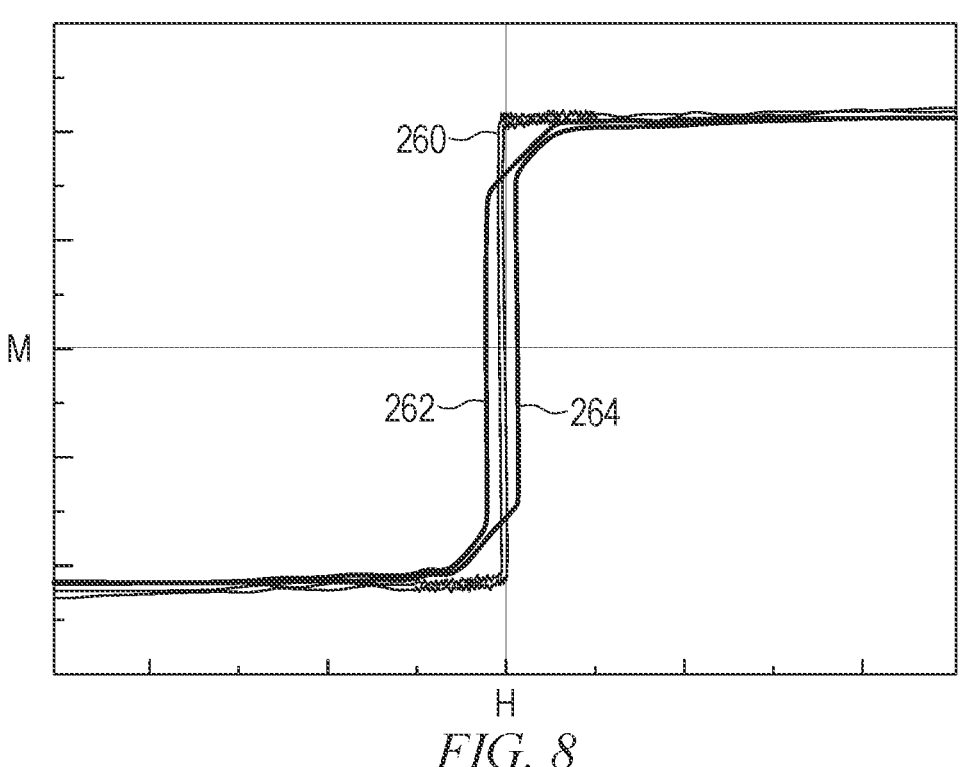
FIG. 8 illustrates additional M and H magnetic fields for the magnetic film layer prior to laser annealing.

FIGS. 7 and 8 illustrate M and H magnetic field curves or plots for magnetic film material 150 prior to laser annealing, i.e., as in FIGS. 2e and 3a. Plot 252 shows behavior for magnetic film material 150 having a thickness of 0.15 μm. Plot 254 and 256 show behavior for magnetic film material 150 having a thickness of 3.0 μm. As the thickness of magnetic film material 150 increases to several micrometers, the material exhibits low permeability due to the perpendicular anisotropy in the stripe domain. As the coercivity increases, magnetic permeability decreases. The coercivity is related to the magnetic permeability in the magnetic field. Plot 260 shows behavior for magnetic film material 150 having a thickness of 0.15 μm. Plots 262 and 264 show behavior for magnetic film material 150 having a thickness of 0.2 μm. The coercivity increases rapidly after 0.15 μm thickness of magnetic film material 150. Therefore, the magnetic permeability is expected to decrease after 0.15 μm thickness of magnetic film material 150. Hysteresis loop of 0.20 μm magnetic film material 150 shows the typical behaviors of films having stripe domains caused by perpendicular anisotropy, thereby degrading the magnetic properties. In one embodiment, magnetic film material 150 should be deposited below the thickness of 0.15 μm in order to lower the coercive force and thereby increase the permeability. In other words, sputtering alone cannot deposit high crystal quality magnetic thick film with high permeability. The same behavior is true for magnetic film material 196 and 218.

To improve the magnetic permeability, laser spike annealing, as described herein, makes the sputtered several micrometer thick magnetic film achieve high magnetic permeability and high crystal quality on the surface of SiP modules. Laser spike annealing is a fast, high energy process, leaving no encapsulation defects, such as cracking or thermal deformation.

Figure 9:
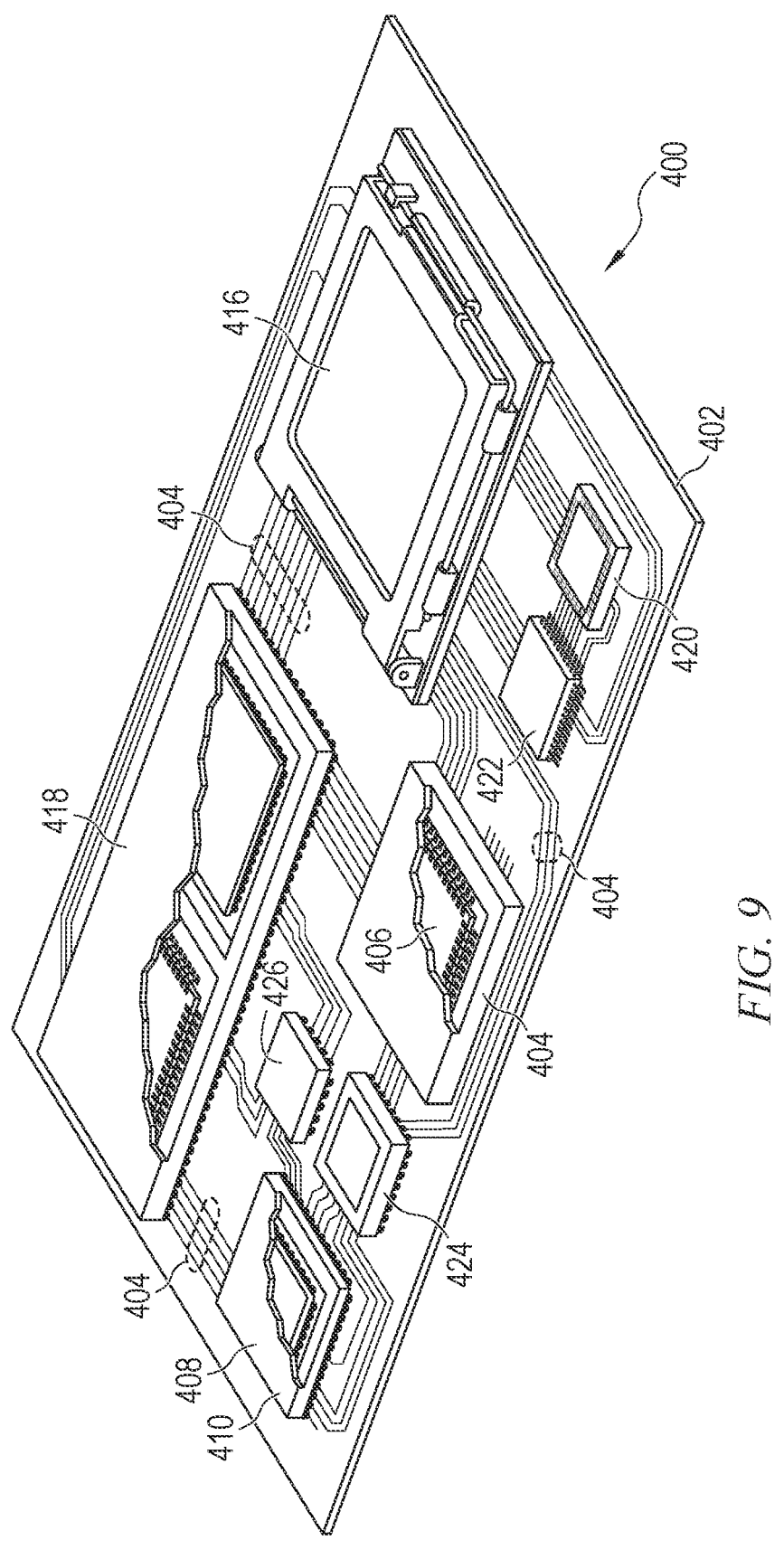
FIG. 9 illustrates a printed circuit board (PCB) with different types of packages disposed on a surface of the PCB.

FIG. 9 illustrates electrical device 400 having a chip carrier substrate or PCB 402 with a plurality of semiconductor packages disposed on a surface of PCB 402, including SiP 189, 208, 230, and 250. Electrical device 400 can have one type of semiconductor package, or multiple types of semiconductor packages, depending on the application.

Electrical device 400 can be a stand-alone system that uses the semiconductor packages to perform one or more electrical functions. Alternatively, electrical device 400 can be a subcomponent of a larger system. For example, electrical device 400 can be part of a tablet, cellular phone, digital camera, communication system, or other electrical device. Alternatively, electrical device 400 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 9, PCB 402 provides a general substrate for structural support and electrical interconnect of the semiconductor packages disposed on the PCB. Conductive signal traces 404 are formed over a surface or within layers of PCB 402 using evaporation, electrolytic plating, electroless plating, screen printing, or other suitable metal deposition process. Signal traces 404 provide for electrical communication between each of the semiconductor packages, mounted components, and other external system components. Traces 404 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically disposed directly on the PCB. For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) or SIP module 418, quad flat non-leaded package (QFN) 420, quad flat package 422, embedded wafer level ball grid array (eWLB) 424, and wafer level chip scale package (WLCSP) 426 are shown disposed on PCB 402. In one embodiment, eWLB 424 is a fan-out wafer level package (Fo-WLP) and WLCSP 426 is a fan-in wafer level package (Fi-WLP). Depending upon the system requirements, any combination of semiconductor packages, configured with any combination of first and second level packaging styles, as well as other electrical components, can be connected to PCB 402. In some embodiments, electrical device 400 includes a single attached semiconductor package, while other embodiments call for multiple interconnected packages. By combining one or more semiconductor packages over a single substrate, manufacturers can incorporate pre-made components into electrical devices and systems. Because the semiconductor packages include sophisticated functionality, electrical devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:

providing a substrate;

disposing an electrical component over the substrate;

depositing an encapsulant over the electrical component and substrate;

forming a magnetic film material over the encapsulant;

laser spike annealing the magnetic film material in a magnetic field; and forming a shielding layer over the magnetic film material.

2. The method of claim 1, wherein the shielding layer extends down a side surface of the semiconductor device.

3. The method of claim 1, further including:

disposing a first magnet on a first side of the semiconductor device; and disposing a second magnet on a second side of the semiconductor device opposite the first side of the semiconductor device, wherein the first magnet has a first pole and the second magnet has a second pole opposite the first pole.

4. A method of making a semiconductor device, comprising:

providing a substrate;

forming a magnetic film material over the substrate;

laser spike annealing the magnetic film material in a magnetic field; and forming a shielding layer over the magnetic film material.

5. The method of claim 4, further including:

disposing an electrical component over the substrate; and depositing an encapsulant over the electrical component and substrate.

6. The method of claim 4, wherein the shielding layer extends down a side surface of the semiconductor device.

7. The method of claim 4, further including:

disposing a first magnet on a first side of the semiconductor device; and disposing a second magnet on a second side of the semiconductor device opposite the first side of the semiconductor device, wherein the first magnet has a first pole and the second magnet has a second pole opposite the first pole.

8. A semiconductor device, comprising:

a substrate;

an electrical component disposed over the substrate;

an encapsulant deposited over the electrical component and substrate;

a magnetic film material formed over the encapsulant, wherein the magnetic film material is laser spike annealed in a magnetic field; and a shielding layer formed over the magnetic film material.

9. The semiconductor device of claim 8, wherein the shielding layer extends down a side surface of the semiconductor device.

10. A semiconductor device, comprising:

a substrate;

an electrical component disposed over the substrate;

an encapsulant deposited over the electrical component and substrate;

a magnetic film material formed over the encapsulant, wherein the magnetic film material is laser spike annealed in a magnetic field;

a first magnet disposed on a first side of the semiconductor device; and a second magnet disposed on a second side of the semiconductor device opposite the first side of the semiconductor device, wherein the first magnet has a first pole and the second magnet has a second pole opposite the first pole.

11. A semiconductor device, comprising:

a substrate;

a magnetic film material formed over the substrate, wherein the magnetic film material is laser spike annealed in a magnetic field; and a shielding layer formed over the magnetic film material.

12. The semiconductor device of claim 11, further including:

an electrical component disposed over the substrate; and an encapsulant deposited over the electrical component and substrate.

13. The semiconductor device of claim 11, wherein the shielding layer extends down a side surface of the semiconductor device.

14. A semiconductor device, comprising:

a substrate;

a magnetic film material formed over the substrate, wherein the magnetic film material is laser spike annealed in a magnetic field;

a first magnet disposed on a first side of the semiconductor device; and a second magnet disposed on a second side of the semiconductor device opposite the first side of the semiconductor device, wherein the first magnet has a first pole and the second magnet has a second pole opposite the first pole.

* * * * *